(12) United States Patent
Wang et al.

(10) Patent No.: US 7,763,896 B2
(45) Date of Patent: Jul. 27, 2010

(54) LIGHT EMITTING DIODE WITH AUXILIARY ELECTRIC COMPONENT

(75) Inventors: Chun-Wei Wang, Miao-Li Hsien (TW); Hung-Kuang Hsu, Miao-Li Hsien (TW); Wen-Jang Jiang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 31 days.

(21) Appl. No.: 12/168,783

(22) Filed: Jul. 7, 2008

(65) Prior Publication Data
US 2009/0078960 A1 Mar. 26, 2009

(30) Foreign Application Priority Data
Sep. 21, 2007 (CN) .................. 2007 1 0201796.7

(51) Int. Cl.
*H01L 25/16* (2006.01)
(52) U.S. Cl. ................ 257/82; 257/E25.032; 313/523
(58) Field of Classification Search ............ 257/81, 257/82, E25.032; 438/22; 250/551; 313/523, 313/524
See application file for complete search history.

(56) References Cited

U.S. PATENT DOCUMENTS

| 5,151,628 | A | 9/1992 | Osawa | |
|---|---|---|---|---|
| 7,252,408 | B2 * | 8/2007 | Mazzochette et al. | 362/294 |
| 2006/0244118 | A1 * | 11/2006 | Roberts et al. | 257/686 |
| 2007/0018191 | A1 * | 1/2007 | Roh et al. | 257/99 |
| 2007/0057267 | A1 | 3/2007 | Oman | |
| 2009/0090926 | A1 * | 4/2009 | Wang et al. | 257/99 |

FOREIGN PATENT DOCUMENTS

| CN | 1434522 A | 8/2003 |
|---|---|---|
| CN | 2720645 Y | 8/2005 |
| CN | 1741292 A | 3/2006 |
| CN | 2814677 Y | 9/2006 |

* cited by examiner

*Primary Examiner*—W. David Coleman
*Assistant Examiner*—Daniel Shook
(74) *Attorney, Agent, or Firm*—Andrew C. Cheng

(57) ABSTRACT

An exemplary LED includes a substrate, an LED chip, a light pervious encapsulation, and an auxiliary electric component. The substrate includes a first surface, an opposite second surface, and an accommodating space defined therein between the first surface and the second surface. The LED chip is mounted on the first surface of the substrate. The light pervious encapsulation is formed on the substrate and covers the LED chip. The auxiliary electric component is received in the accommodating space between the first and second surfaces of the substrate.

12 Claims, 4 Drawing Sheets

LIGHT EMITTING DIODE WITH AUXILIARY ELECTRIC COMPONENT

BACKGROUND

1. Technical Field

The present invention relates to a light emitting diode (LED), and particularly, to LEDs with auxiliary electric components.

2. Description of Related Art

An LED includes a substrate, an LED chip disposed on the substrate, and a light pervious encapsulation covering the LED chip. The LED chip emits light therefrom, and then the light passes through the light pervious encapsulation to illuminate.

In order to improve the property of the LEDs, some auxiliary electric components have been used in the LEDs. For example, zener diodes have been used in the LEDs to prevent the LEDs from reverse breakdown caused by static electricity.

Conventionally, both the auxiliary electric component and the LED chip are both disposed on a flat surface of the substrate. Hence, the auxiliary electric component may absorb a part of light and block a part of light from emitting out of the light pervious encapsulation. As a result, the brightness of the LED is decreased and the luminous efficiency of the LED is degraded.

Therefore, a new LED is desired to overcome the above mentioned problems.

SUMMARY

An exemplary LED includes a substrate, an LED chip, a light pervious encapsulation, and an auxiliary electric component. The substrate includes a first surface, an opposite second surface, and an accommodating space defined therein between the first surface and the second surface. The LED chip is mounted on the first surface of the substrate. The light pervious encapsulation is formed on the substrate and covers the LED chip. The auxiliary electric component is received in the accommodating space between the first and second surfaces of the substrate.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below with reference to the drawings.

Figure 1:
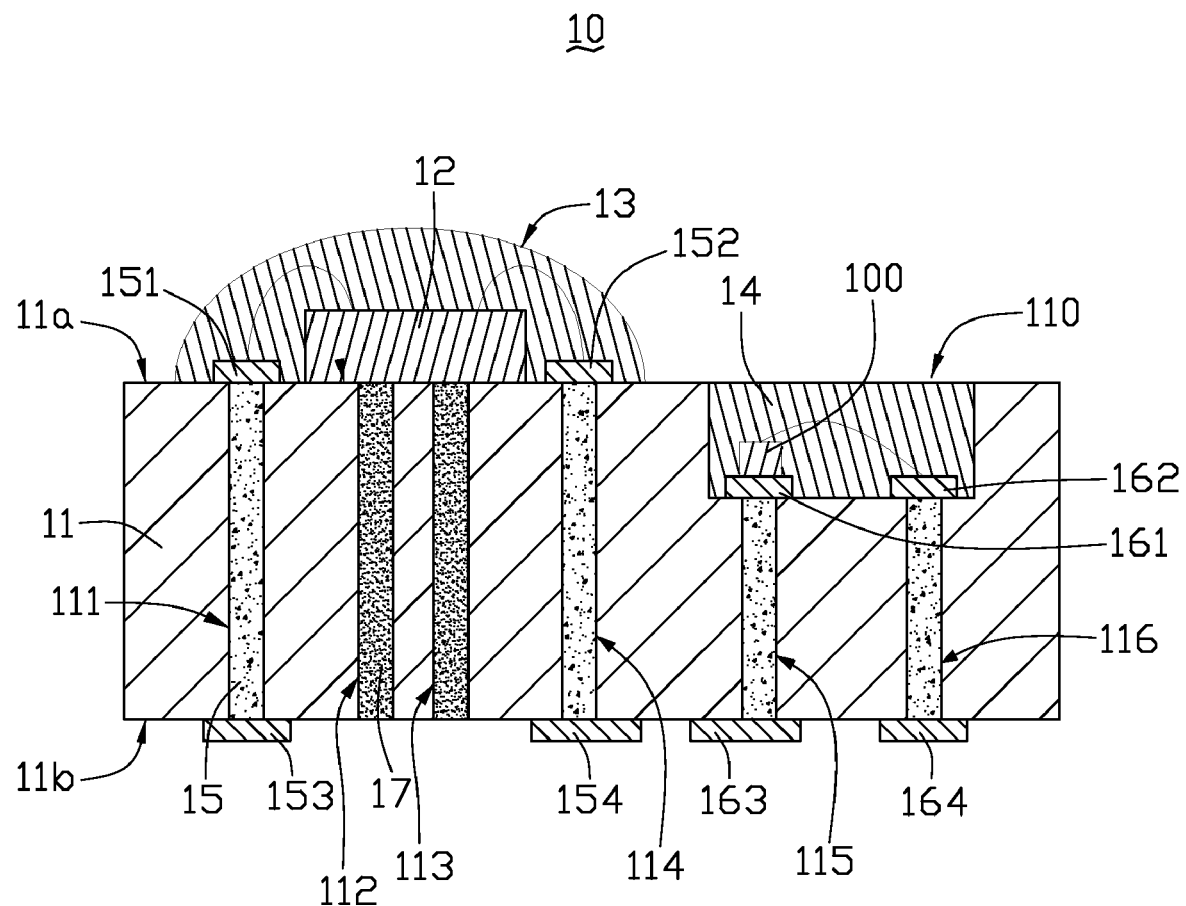
FIG. 1 is a schematic, cross-sectional view of an LED of a first embodiment.

Referring to FIG. 1, an LED 10 according to a first embodiment is shown. The LED 10 includes a substrate 11, an LED chip 12, a light pervious encapsulation 13, and an auxiliary electric component 100.

The substrate 11 is configured for supporting the LED chip 12 and the encapsulation 13 thereon, and for dissipating heat generated from the LED chip 12. The substrate 11 includes a first surface 11a and an opposite second surface 11b. An accommodating space 110 is defined in the first surface 11a of the substrate 11 away from the encapsulation 13. The accommodating space 10 is configured for receiving the auxiliary electric component 100 therein (described in detail later). Four through holes 111, 114, 115, 116 extend through the substrate 11 and are filled with an electrically conductive material 15. The electrically conductive material 15 can be an electrically conductive paste or a metal, such as gold, silver, and so on. The through holes 15, 116 communicate with the accommodating space 110. Another two through holes 112, 113 extend through the substrate 11 from the first surface 11a and the second surface 11b, and are filled with a thermally conductive material 17. The thermally conductive material 17 can be a thermally conductive paste or a metal, such as gold, silver, copper, and so on. The substrate 11 can be made of ceramic material, which has a good electrically insulation property. The ceramic material can be made of aluminum oxide, magnesium oxide, aluminum nitride, silicon dioxide, boron nitride, or beryllium oxide.

The LED chip 12 is mounted directly on the first surface 11a of the substrate 11. The substrate 11 dissipates the heat generated by the LED chip 12 towards the outside of the LED 10. The LED chip 12 includes a first front electrode 151, a first back electrode 153, a second front electrode 152, and a second back electrode 154. The first front electrode 151 and the second front electrode 152 are formed on the first surface 11a, and the first back electrode 153 and the second back electrode 154 are formed on the second surface 11b. The first front electrode 151 and the first back electrode 153 are interconnected by the electrically conductive material 15 in the through hole 111, and the second front electrode 152 and the second back electrode 154 are interconnected by the electrically conductive material 15 in the through hole 114. The thermally conductive material 17 in the through holes 112, 113 contacts with the LED chip 12 to increase the heat dissipation efficiency of the LED 10.

The encapsulation 13 is disposed on the first surface 11a of the substrate and covers the LED chip 12. The encapsulation 13 is configured for optically adjusting (e.g., diverging or converging) a direction of the light emitted from the LED chip 12, thus adjusting an illuminating scope of the LED 10. In addition, the encapsulation 13 protects the LED chip 12 from contaminants. The encapsulation 13 is arc-shaped.

The auxiliary electric component 100 is completely received in the accommodating space 110 positioned below the first surface 11a of the substrate 11. Hence, the auxiliary electric component 100 does not absorb/block light emitted from the LED chip 12. All the light emitted from the LED chip 12 can reach the encapsulation 13. As a result, the brightness and the luminous efficiency of the LED 10 are stably maintained. A protecting paste 14 is formed on top of the auxiliary electric component 100 to cover the auxiliary electric component 100. The auxiliary electric component 100 includes a third front electrode 161, a third back electrode 163, a fourth front electrode 162, and a fourth back electrode 164. The third front electrode 161 and the third back electrode 163 are interconnected by the electrically thermally conductive material 15 in the through hole 115, and the fourth front electrode 162 and the fourth back electrode 164 are interconnected by the electrically thermally conductive material 15 in the through hole 116.

In the present embodiment, the auxiliary electric component 100 is an anti-static electric component. The auxiliary electric component 100 is electrically connected with the LED chip 12 in parallel (not shown) so that the auxiliary electric component 100 prevents the LED chip 12 from reverse breakdown caused by static electricity. The anti-static electric component can be a zener diode, a schottky barrier diode (SND), a silicon-based tunneling diode, or an integrated circuit for static electricity protection. The protective paste 14 is filled in the accommodating space 110, and covers the LED chip 12.

Figure 2:
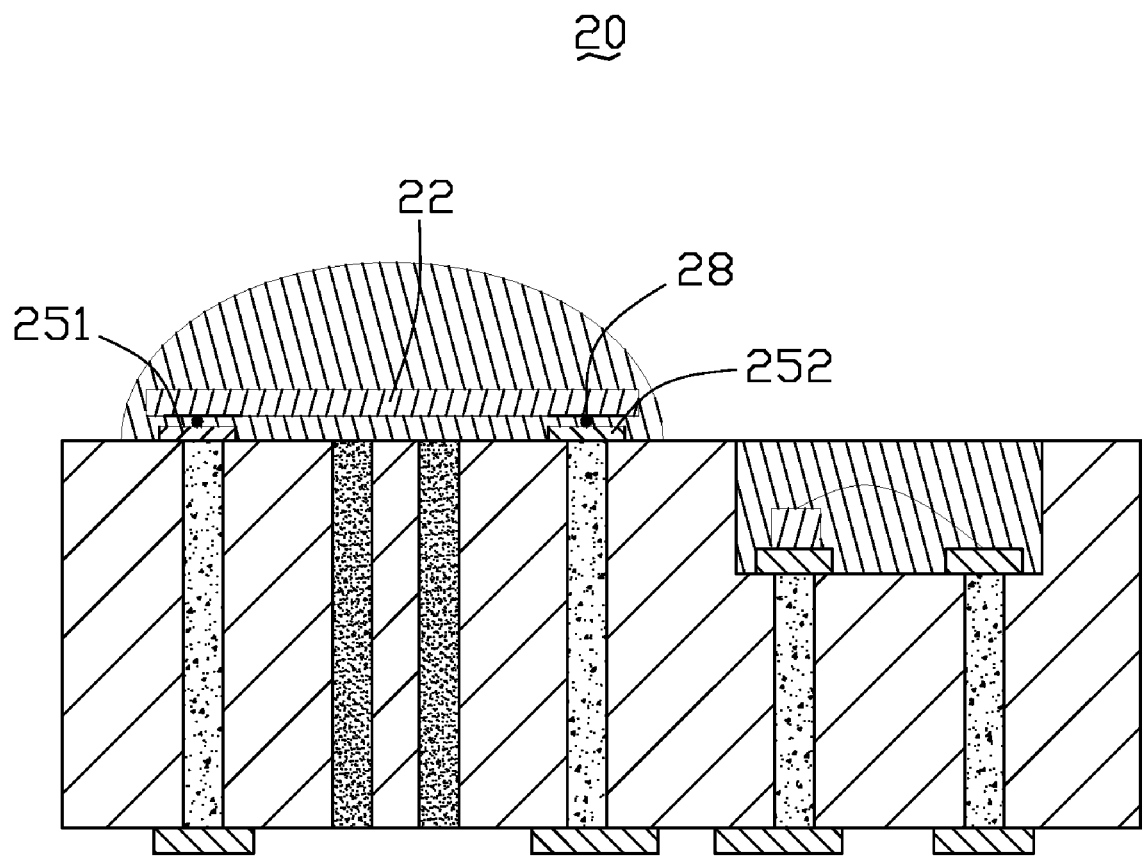
FIG. 2 is a schematic, cross-sectional view of an LED of a second embodiment.

Referring to FIG. 2, an LED 20 according to a second embodiment is shown. The LED 20 includes an LED chip 22, a first front electrode 251 and a second front electrode 252. The LED 20 is similar to the LED 10 except that the LED chip 22 is electrically connected to the first front electrode 251 and the second front electrode 252 by two metal protrusions 28 (e.g., two tin balls) using a flip chip process.

Figure 3:
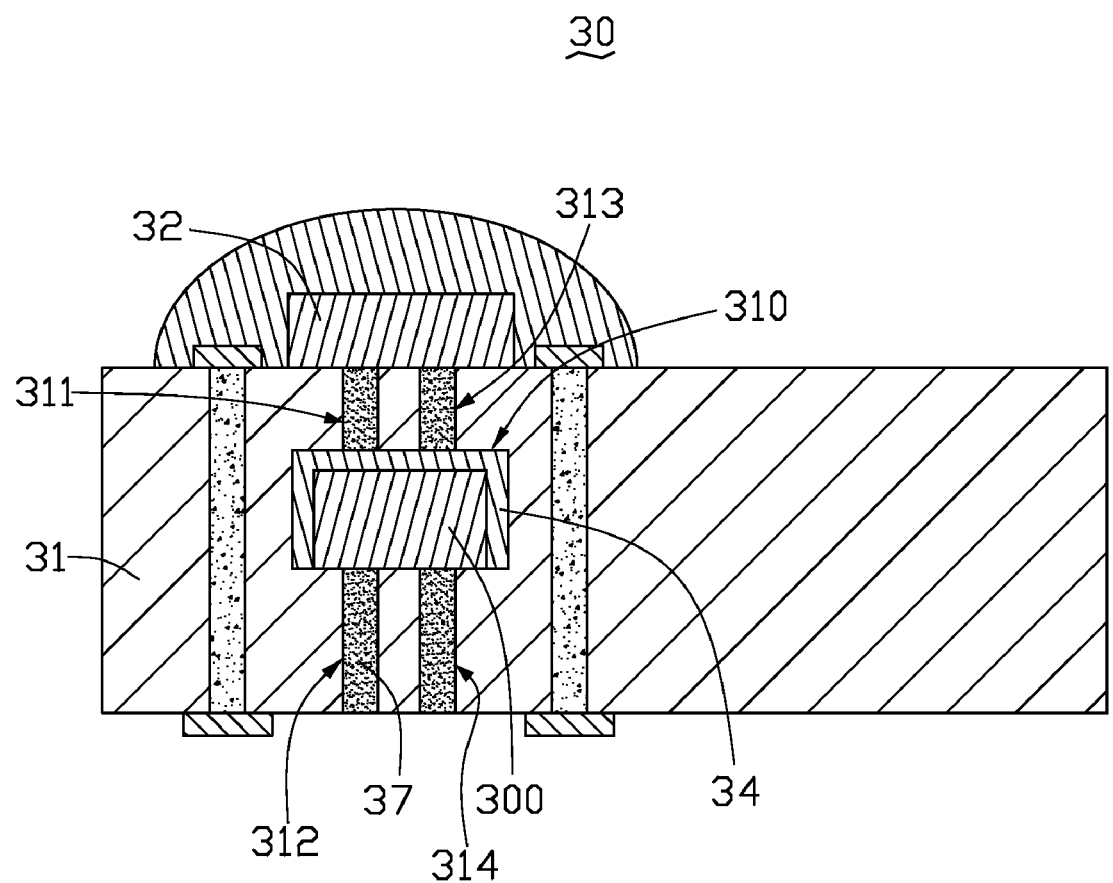
FIG. 3 is a schematic, cross-sectional view of an LED of a third embodiment.

Referring to FIG. 3, an LED 30 according to a third embodiment is shown. Similar to the LED 10, the LED 30 includes a substrate 31, an LED chip 32 disposed on the substrate 31, and an auxiliary electric component 310. In the present embodiment, the auxiliary electric component 300 is a thermal sensor configured for measuring the temperature of the LED chip 32. It should be noted that the thermal sensor can be connected with a cooling system (not shown) for keeping the temperature of the LED 30 in a predetermined range, thereby extending the life-span of the LED 30.

An accommodating space 310 is defined in the substrate 31 right below the LED chip 32. The auxiliary electric component 300 is completely received in the accommodating space 310, and is adjacent to the LED chip 32. A protective paste 34 is filled in the accommodating space 310, and covers the auxiliary electric component 300. The substrate 31 has four holes 311, 312, 313, 314 defined therein, each of which communicates with the accommodating space 310. The holes 311, 312, 313, 314 are filled with thermally conductive material 37. The thermally conductive material 37 in the holes 311, 313 connects to the LED chip 32 and the protective paste 34 so that the temperature of the LED chip 32 can be precisely measured. The thermally conductive material 37 in the holes 312, 314 connects to the LED chip 32 and a surface of the substrate 31. It should be noted that the thermal sensor can be connected with a cooling system to stabilizing the temperature of the LED chip 32.

Figure 4:
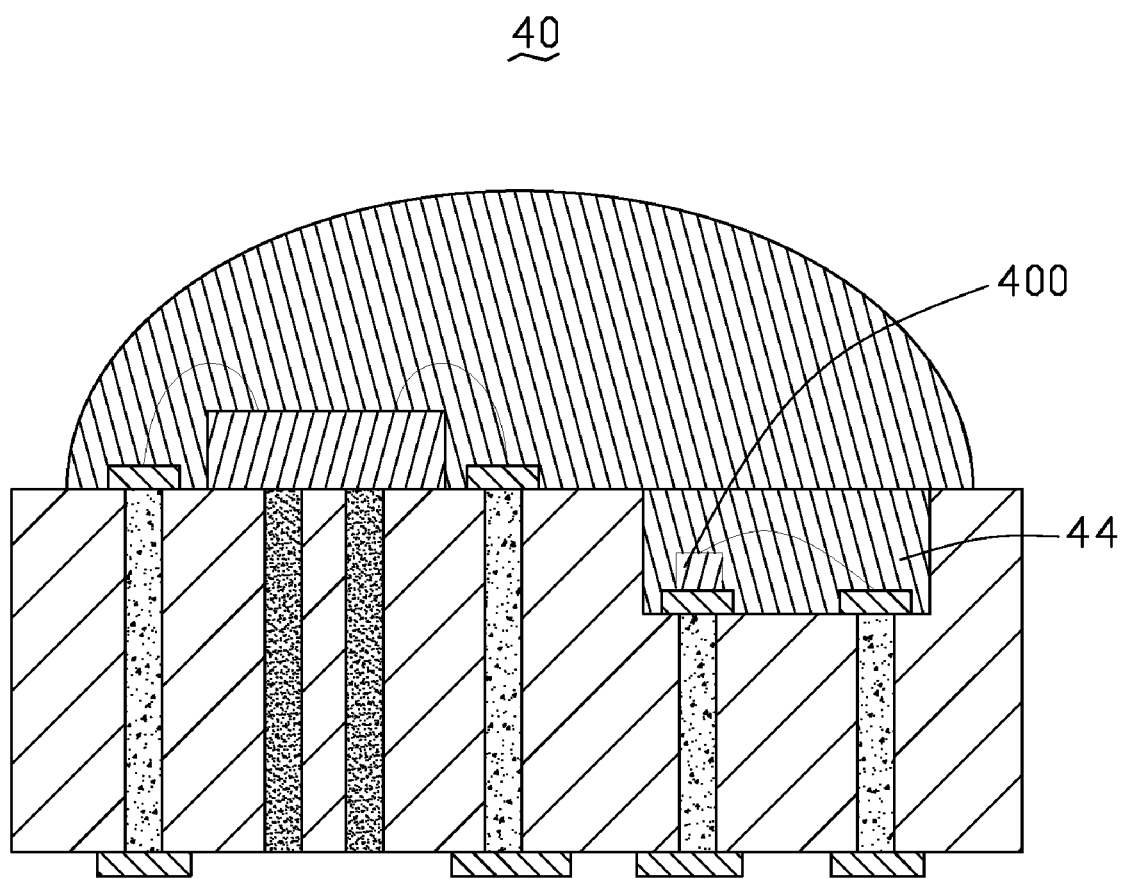
FIG. 4 is a schematic, cross-sectional view of an LED of a fourth embodiment.

Referring to FIG. 4, an LED 40 according to a third embodiment is shown. The LED 40 is similar to the LED 10 except that the auxiliary electric component 400 is a light intensity sensor. A protective paste 44 covers the auxiliary electric component 400. A refractive index of the protective paste is equal to that of the light pervious encapsulation, for example, in an approximate range of from 1.4 to 1.55. Hence, an index non-matching problem between the protective paste and the light pervious encapsulation is eliminated so that the auxiliary electric component 400 can precisely measure the light intensity of the LED chip (not labeled). It should be noted that the light intensity sensor can be connected with a feedback circuit (not shown) for stabilizing the intensity of the LED 40.

While certain embodiments have been described and exemplified above, various other embodiments from the foregoing disclosure will be apparent to those skilled in the art. The present invention is not limited to the particular embodiments described and exemplified but is capable of considerable variation and modification without departure from the scope of the appended claims.

What is claimed is:

1. An LED comprising:
   a substrate having a first surface, an opposite second surface, and an accommodating space defined in the first surface;
   an LED chip mounted on the first surface of the substrate;
   a light pervious encapsulation formed on the substrate and covering the LED chip; and
   a light intensity sensor received in the accommodating space between the first and second surfaces of the substrate.

2. An LED comprising:
   a substrate having a first surface, an opposite second surface and an accommodating space defined in the first surface;
   an LED chip disposed on the first surface of the substrate and in contact with the first surface of the substrate;
   a light pervious encapsulation formed on the first surface of the substrate and covering the LED chip; and
   a light intensity sensor received in the accommodating space and entirely located below the first surface of the substrate.

3. The LED as claimed in claim 1, wherein the light pervious encapsulation covers the accommodating space.

4. The LED as claimed in claim 1, wherein the substrate is comprised of ceramic material.

5. The LED as claimed in claim 1, wherein the substrate has a through hole defined therein, the through hole being filled with a thermally conductive material, the thermally conductive material being in thermal contact with the LED chip.

6. The LED as claimed in claim 1, wherein a protective paste is filled in the accommodating space, and the protective paste covers the light intensity sensor.

7. The LED as claimed in claim 3, wherein a protective paste is filled in the accommodating space, and a refractive index of the protective paste is equal to that of the light pervious encapsulation.

8. The LED as claimed in claim 2, wherein the light pervious encapsulation covers the accommodating space.

9. The LED as claimed in claim 2, wherein the substrate is comprised of ceramic material.

10. The LED as claimed in claim 2, wherein the substrate has a through hole defined therein, the through hole being filled with a thermally conductive material, the thermally conductive material being in thermal contact with the LED chip.

11. The LED as claimed in claim 2, further comprising a protective paste, the accommodating space filled with the protective paste, the protective paste covering the light intensity sensor.

12. The LED as claimed in claim 8, further comprising a protective paste, the accommodating space filled with the protective paste, a refractive index of the protective paste being equal to that of the light pervious encapsulation.

* * * * *